United States Patent [19]

Ramakrishnan et al.

[11] Patent Number: 5,497,321
[45] Date of Patent: Mar. 5, 1996

[54] WELL LOGGING METHOD FOR DETERMINING FRACTIONAL FLOW CHARACTERISTICS OF EARTH FORMATIONS

[75] Inventors: T. S. Ramakrishnan, Bethel; David J. Wilkinson, Ridgefield, both of Conn.

[73] Assignee: Schlumberger Technology Corporation, Ridgefield, Conn.

[21] Appl. No.: 180,083

[22] Filed: Jan. 11, 1994

[51] Int. Cl.$^6$ ............................................. G06F 19/00
[52] U.S. Cl. ................................................. 364/422
[58] Field of Search ....................... 364/421, 422; 324/347, 375, 353, 324; 166/250; 73/151, 152, 155; 367/27

[56] References Cited

U.S. PATENT DOCUMENTS

| | | | |
|---|---|---|---|
| 4,873,488 | 10/1989 | Barber et al. | 324/339 |
| 4,974,446 | 12/1990 | Vigneaux | 73/155 |
| 5,335,542 | 8/1994 | Ramakrishnan et al. | 73/152 |
| 5,343,440 | 8/1994 | Kan et al. | 367/27 |

OTHER PUBLICATIONS

Hunka et al., "A New Resistivity Measurement System For Deep Formation Imaging And High Resolution Formation Evaluation", SPE-20559, 1990.
S. E. Buckley et al., Mechanism Of Fluid Displacement In Sands, Trans. Am. Inst. Min. Met. Petr. Eng., 146, 1942.
T. S. Ramakrishnan, Application of Fractional Flow Theory To High pH Flooding, IIT Chicago, PhD Thesis, University Microfilms, 1985.
Campbell et al., Displacement Logging—A New Exploratory Tool, Petroleum Transactions, AIME, vol. 204, pp. 233–239, 1955.
Waxman and Smits, Electrical Conductivities in Oil–Bearing Sands, Soc. Petr. Eng. J., vol. 8, 1968.
T. S. Ramakrishnan et al., Effect Of Capillary Number On The Relative Permeabilty Function For Two–Phase Flow In Porous Media, Powder Technology, 48, 1986, 99–124.
C. S. Land, Calculation of Imbibition Relative Permeability for Two– and Three–Phase Flow From Rock Properties, Soc. Pet. Eng. J., 8, 1968, 149.
B. Anderson et al., "ELMOD—Putting Electromagnetic Modeling To Work To Improve Resistivity Log Interpretation", Transactions of SPWLA 30th Annual Logging Symposium, Jun., 1989.
R. H. Brooks et al., J. Irrig. Drain. Div., 92, 1966.
Gondouin, M. and A. Heim, Experimentally Determined Resistivity Profiles in Invaded Water and Oil Sands for Linear Flows, Journal of Petroleum Technology, vol. 16, pp. 337–348, 1964.
Barber, T. and R. Rosthal, Using a Multi-array Induction Tool to Achieve High Resolution Logs with Minimum Environmental Effects, SPE 22725, Oct., 1991.
Allen et al., Invasion Revisted, Oilfield Review, 1991.
A. Q. Howard, "A New Invasions Model For Resistivity Log Interpretation", The Log Analyst, Mar.–Apr., 1992.

*Primary Examiner*—Donald E. McElheny, Jr.
*Attorney, Agent, or Firm*—Leonard W. Pojunas; Martin M. Novack

[57] ABSTRACT

A logging tool provides a log of fractional flow characteristics of formations surrounding an earth borehole. The logging tool is suspended in the borehole and resistivity measurements are made at different radial depths of investigation while the logging tool is moved through the borehole to obtain several resistivity logs. Model fractional flow parameters are selected, and a formation conductivity model as a function of the model fractional flow parameters is determined. Several simulated resistivity log values are generated at respective radial depths of investigation from the formation conductivity model. The simulated resistivity log values are compared with values from the resistivity logs of the resistivity measurements to obtain an error indication. The model fractional flow parameters is modified accordingly. Steps are repeated until a predetermined criterion is met, then an output of formation fractional flow characteristics is produced.

21 Claims, 13 Drawing Sheets

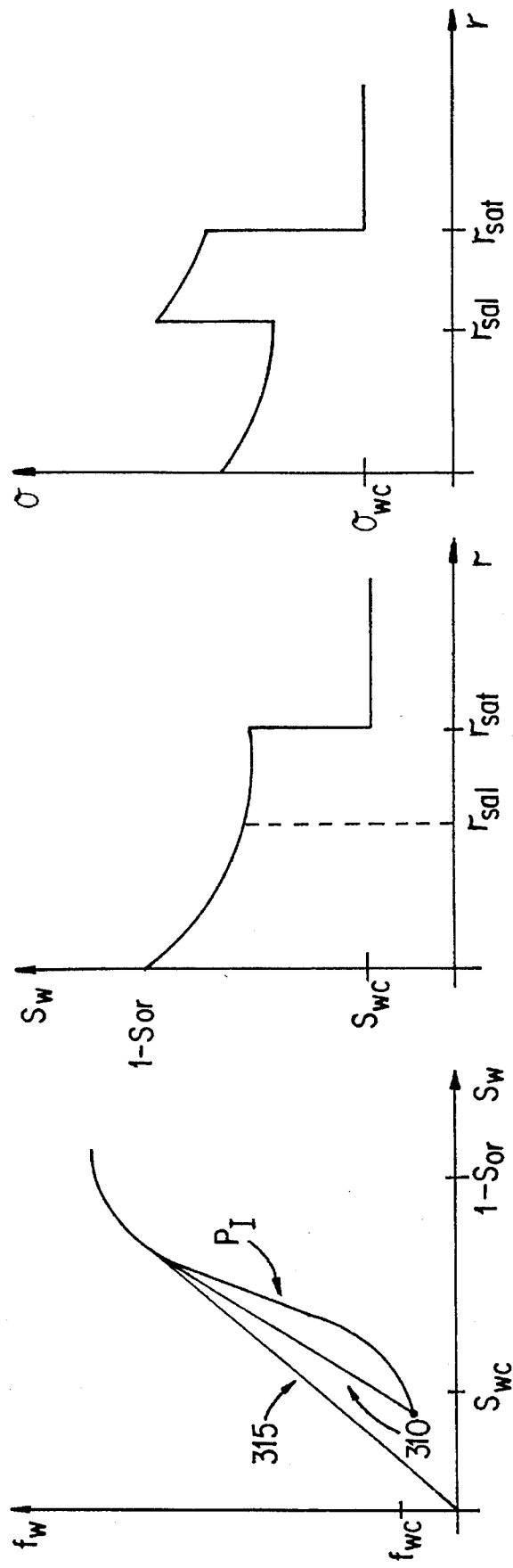

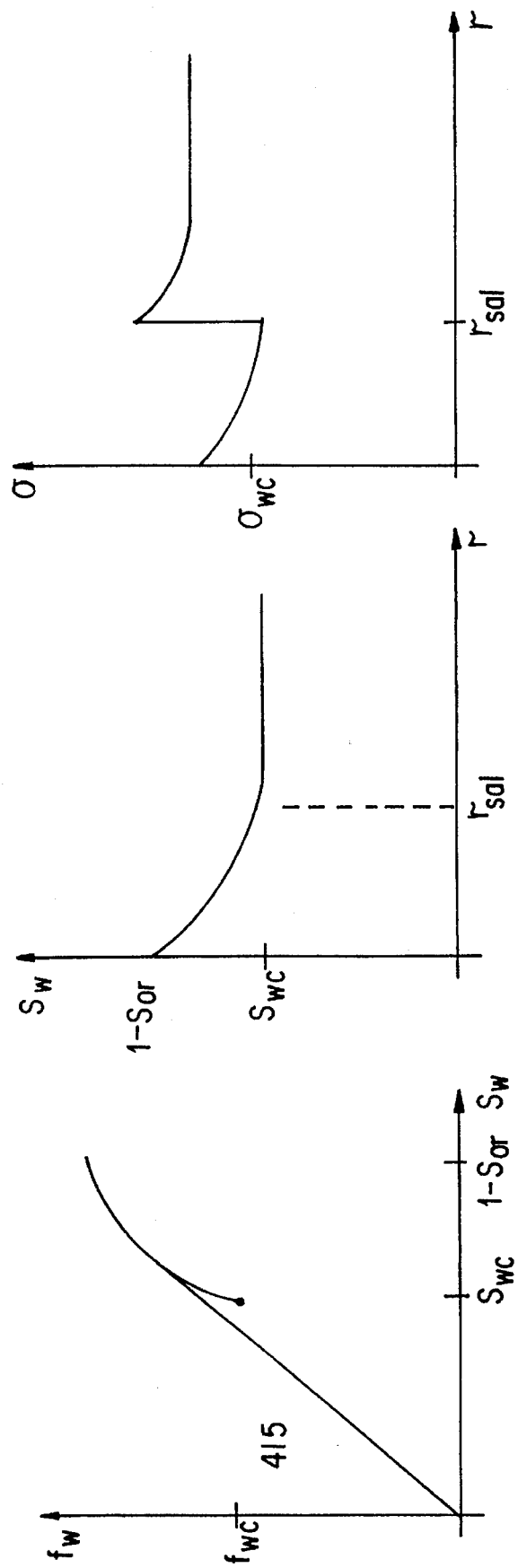

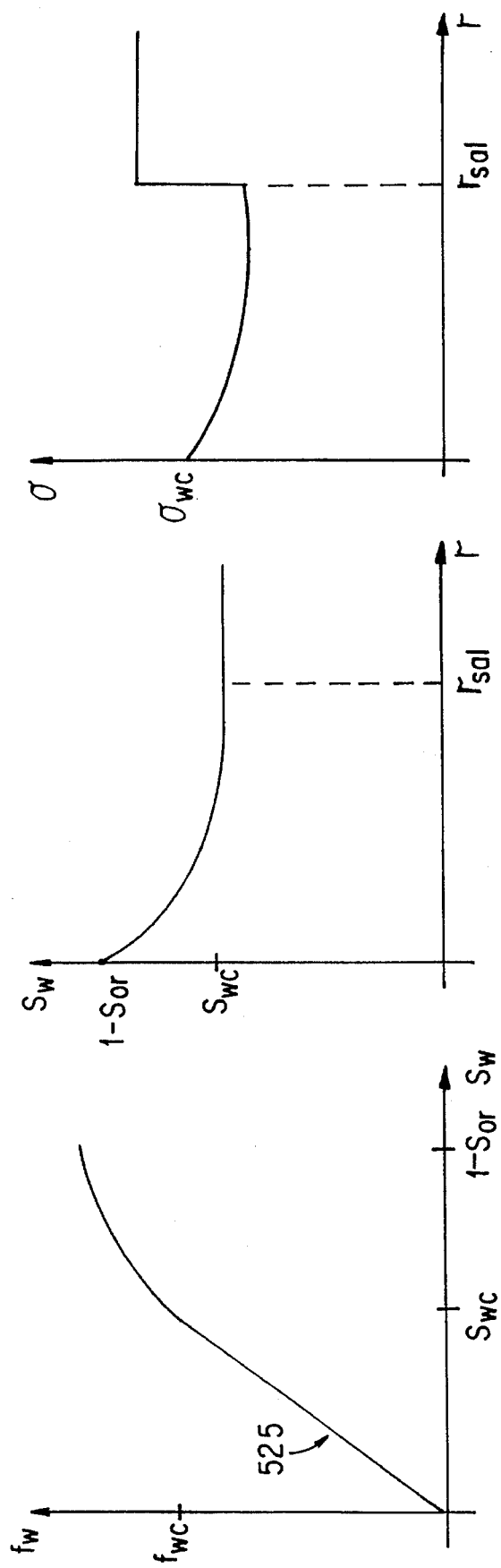

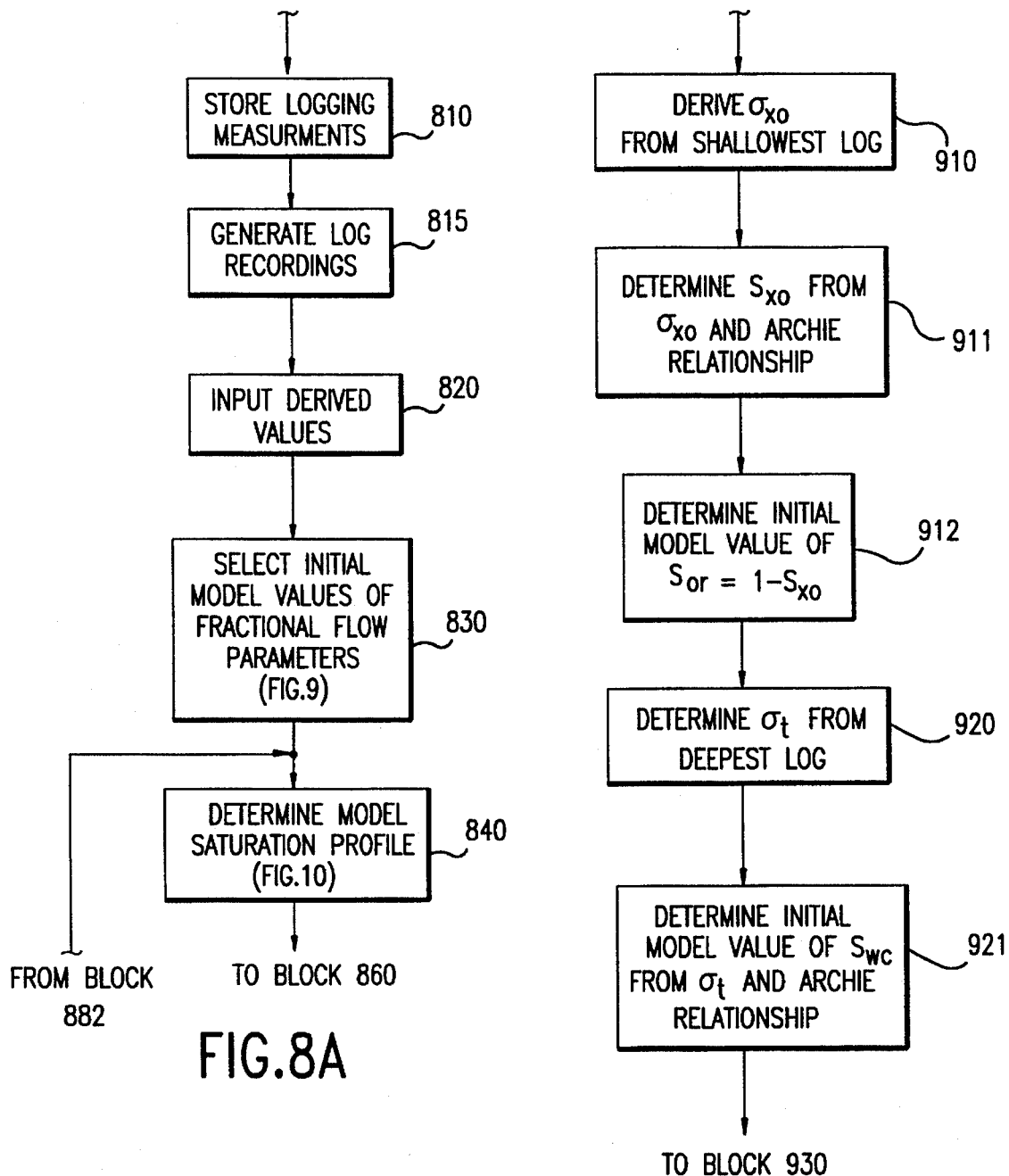

WELL LOGGING METHOD FOR DETERMINING FRACTIONAL FLOW CHARACTERISTICS OF EARTH FORMATIONS

BACKGROUND OF THE INVENTION

This invention relates to logging of earth boreholes to obtain fractional flow characteristics of formations that are indicative of formation producibility and, more particularly, to a logging technique which utilizes resistivity measurements in the obtainment of fractional flow characteristics.

The logging of formations surrounding earth boreholes to obtain indications of the general nature of the fluids present in rock, and to obtain indications of the porosity of the rock, is a well developed art. For example, resistivity logs, which can measure formation resistivity at a specified radial depth of investigation into the formations, can be used to distinguish between oil bearing formations and water bearing formations. [The term "oil" is used herein for ease of description, and can mean other hydrocarbons as well.] As a simple example, if it is generally known that the connate water in formations uninvaded by drilling filtrate is relatively salty (and therefore of relatively low resistivity), a resistivity measurement that "sees" deep into the formation will measure a relatively low resistivity in a water bearing formation and a relatively high resistivity in an oil bearing formation. The resistivity of the so-called invaded (or "flushed") zone adjacent the borehole, where drilling fluid filtrate has replaced at least some of the original fluids in the invaded formations, is typically measured with a resistivity logging device having a relatively shallow radial depth of investigation, and can also be very useful in determining formation properties. The porosity of formations is also determinable from well logging devices such as acoustic logging tools or neutron logging tools, and provides a useful measure of the pore space volume of formations. Also, the conductivity of the connate water in the pore spaces of uninvaded formations can be determined by various means including, for example, logging measurements from a spontaneous potential ("SP") logging tool, or sampling with a formation testing device capable of hydraulically contracting the borehole wall and drawing fluid samples from the formations.

If one has reasonably accurate knowledge of the types of characteristics described in the previous paragraph (formation resistivity, porosity, and conductivity of water contained in the formations), one can derive an indication of water saturation in the formation pore spaces using the well known Archie saturation equation. Water saturation, $S_w$, which is the complement of oil saturation, $S_o$, can be an important indication of a volume of oil in a given formation, but it is well recognized that the producibility of a formation also depends strongly on the degree to which oil in the formation can move through the rock for ultimate recovery.

Various factors control the degree to which oil and water will move through rock including, inter alia, the tortuosity of travel paths and the extent to which oil and water are bound to the rock by mobility restricting forces. The fractional flow characteristics of formations are generally representable by the fractional flow curve for such formations, which describes the flow of water (and, therefore, by complementary relationship, oil) in relation to total flow, as a function of water saturation. Important fractional flow characteristics that define the fractional flow curve include: $S_{wr}$ (the residual water saturation), $S_{or}$ (the residual oil saturation), $S_{orm}$ (the maximum possible residual oil saturation, which is related to $S_{or}$), and $S_{wc}$ (the connate water saturation). The fractional flow at connate water saturation, $S_{wc}$, is designated $f_{wc}$.

A reasonable determination of fractional flow characteristics, including those just listed, would be very helpful to production engineers in predicting the production performance of formations, since these characteristics contain information about the fractions of oil and water that may or may not be moved, as well as the flow behavior that can be expected for the fluids that do move. However, in the prior art, some or all of these characteristics have either not been obtainable with sufficient accuracy by any means, or have required formation tests and procedures (including tests which perforate, sample, and/or core) that are time consuming and expensive, and may not be practical to perform for more than a few selected zones along the length of the borehole.

It is among the objects of the present invention to provide a technique for determining fractional flow characteristics of formations surrounding a borehole, and generating improved logs of said characteristics, without requirement for unduly time consuming and/or expensive downhole procedures and techniques.

SUMMARY OF THE INVENTION

In accordance with a feature of the present invention, several resistivity logs, which measure resistivity at respectively different radial depths of investigation, are utilized in determining fractional flow characteristics of formations. In a form of the invention, parameterization is implemented in the saturation domain, and a conductivity model of the formation is determined so that simulated resistivity logs can be generated and compared with the measured resistivity logs.

More particularly, an embodiment of the invention is directed to a method for producing a log of fractional flow characteristics of formations surrounding an earth borehole, comprising the steps of: (a) suspending a logging tool in the borehole; (b) producing several resistivity measurements, having respectively different radial depths of investigation, as the logging device is moved through the borehole, to obtain several resistivity logs; (c) selecting model fractional flow parameters; (d) determining a formation conductivity model (e.g. a conductivity profile) as a function of said model fractional flow parameters; (e) generating several simulated resistivity log values at said respective radial depths of investigation from the formation conductivity model; (f) comparing the simulated resistivity log values with values from the resistivity logs obtained from the resistivity measurements to obtain an error indication; (g) modifying the model fractional flow parameters; (h) repeating steps (d) through (g) until a predetermined criterion is met; and (i) outputting the modified fractional flow parameters as formation fractional flow characteristics.

In a preferred embodiment of the invention, the fractional flow characteristics include connate water saturation, residual water saturation, and residual oil saturation. In this embodiment, the step of determining a formation conductivity model as a function of the model fractional flow parameters comprises: determining a formation saturation profile as a function of the model fractional flow parameters; and determining the formation conductivity model from the saturation profile. In a form of the invention, the step of determining the formation conductivity model from the saturation profile includes deriving formation porosity and water conductivity, and determining the formation conductivity model from the derived porosity, the derived water conductivity, and the saturation profile.

Further features and advantages of the invention will become more readily apparent from the following detailed description when taken in conjunction with the accompanying drawings.

BRIEF DESCRIPTION OF THE DRAWINGS

FIGS. 3A, 3B, and 3C illustrate fractional flow curves for three different cases with regard to location of the saturation front caused by invasion and the salinity front caused by invasion.

FIGS. 4A, 4B, and 4C illustrate saturation profiles, as a function of radial distance, which are respectively associated with the fractional flow curves illustrated in FIGS. 3A, 3B, and 3C.

FIGS. 5A, 5B, and 5C illustrate conductivity profiles, as a function of radial distance, which are respectively associated with the saturation profiles of FIGS. 4A, 4B and 4C, all for the situation where the filtrate is less conductive than the connate water.

DETAILED DESCRIPTION

Figure 1:
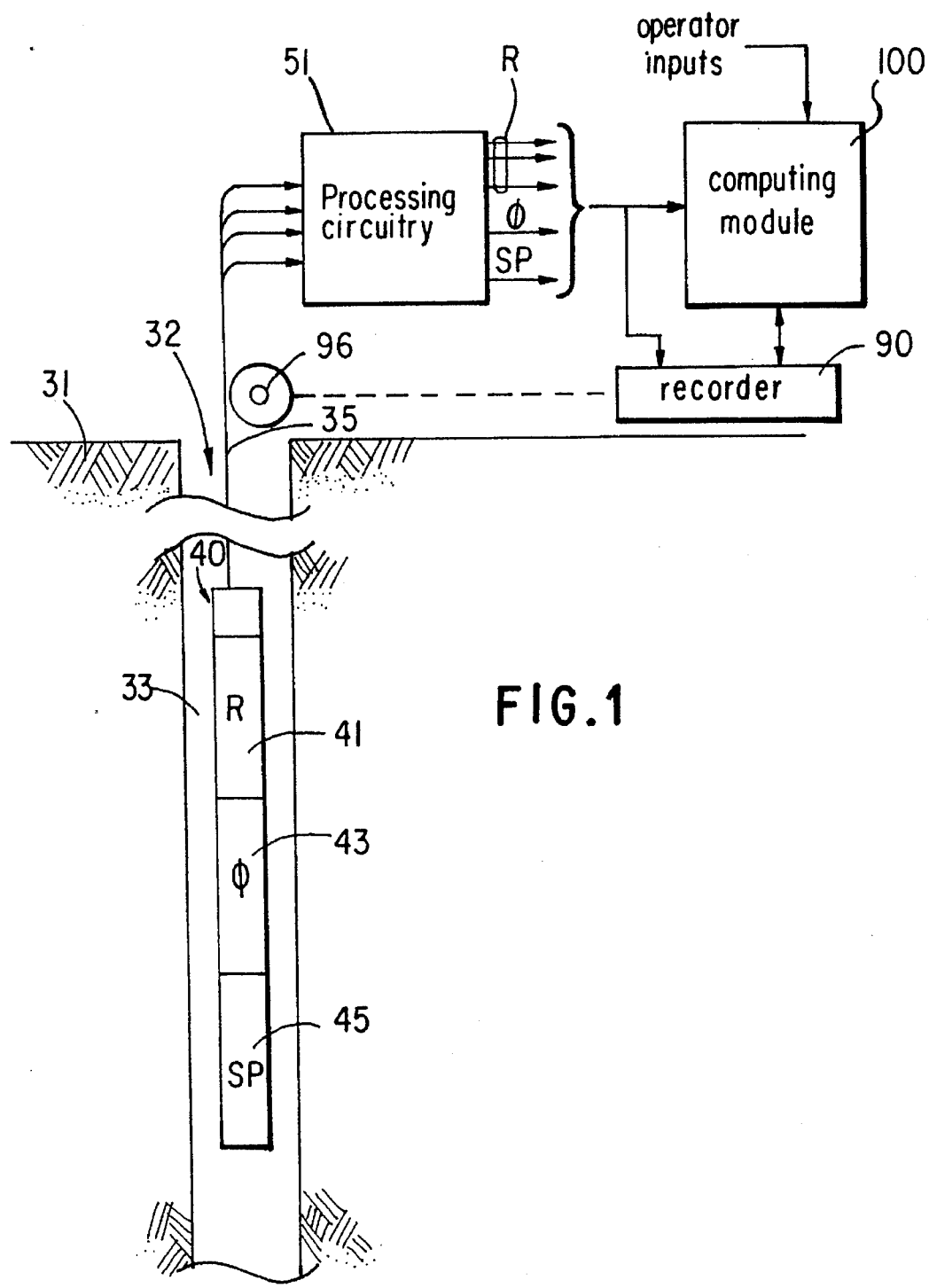
FIG. 1 is a schematic diagram, partially in block form, of equipment that can be utilized in practicing an embodiment of the invention.

FIG. 1 shows an apparatus which can be used to practice an embodiment of the invention for investigation of earth formations 31 traversed by a borehole 32, which is filled with a drilling fluid 33. The investigating apparatus or logging device 40 is suspended in the borehole 32 on an armored cable 35, the length of which substantially determines the depth of the downhole device 40. The cable length is controlled by conventional means at the surface (not shown). Circuitry 51, shown at the surface, although portions thereof may be downhole, represents processing circuitry for the various logging units of apparatus 40. A sheave wheel 96 can be conventionally provided for determination of depth of the logging apparatus, and signals therefrom are coupled with a recorder 90 which generically represents known graphical, electrical, and/or other storage and recording functions performed on signals received from processing circuitry 51 and from a computing module 100. The computing module 100, which in the illustrated embodiment receives inputs from the processing circuitry 51, can be implemented, for example, by a suitably programmed general purpose computer, such as a VAX, sold by Digital Equipment Corp. It will be understood, however, that a suitable special purpose digital or analog computer, which performs functions as described herein, could alternatively be employed.

The downhole device 40 of the present embodiment comprises a tool string that includes a number of tools. In the present embodiment, the reference numeral 41 represents one or more resistivity tools which collectively include the capability of measuring resistivity at several radial depths of investigation and, preferably, at least five radial depths of investigation. It is well known in the art that one or more resistivity logging devices can be employed for this purpose. [Resistivity and conductivity are inverses, and it will be understood that references herein to one of these imply that the other could be substituted, in an inverse sense.] A single device which obtains measurements at several radial depths of investigation is the so-called Array Induction Tool or "AIT", which employs an array of induction coils and signal processing in the obtainment of its resistivity measurements. Reference can be made, for example, to the U.S. Pat. No. 4,873,488 and to Hunka et al., "A New Resistivity Measurement System For Deep Formation Imaging And High Resolution Formation Evaluation", SPE-20559, In Annual Technical Conference And Exhibition Proceedings, Formation Evaluation and Reservoir Geology, Society of Petroleum Engineers, 1991. A further resistivity logging device that can, for example, be utilized in conjunction with "AIT", is the so-called Micro Spherically Focused Log ("MSFL"), which has radial depth of investigation of about two inches. It will be understood that other resistivity logging device(s) can alternatively be employed.

The tool string of downhole apparatus 40 also includes, in this embodiment, a logging device 43 which is used to obtain measurements of porosity, $\phi$. This logging tool may comprise, for example, a conventional type of neutron logging device or a conventional type of acoustic logging device. Further included in the tool string of this embodiment is a spontaneous potential ("SP") logging device 45 which can be used in deriving an indication of the conductivity of connate formation water in the uninvaded zone. The tool string can also typically include appropriate conventional telemetry equipment and power supplies (not separately shown), as well as other logging subassemblies conventionally used with equipment of this type. It will also be understood that at least some of the measurements hereof could be made by equipment on a drill string.

Figure 2:
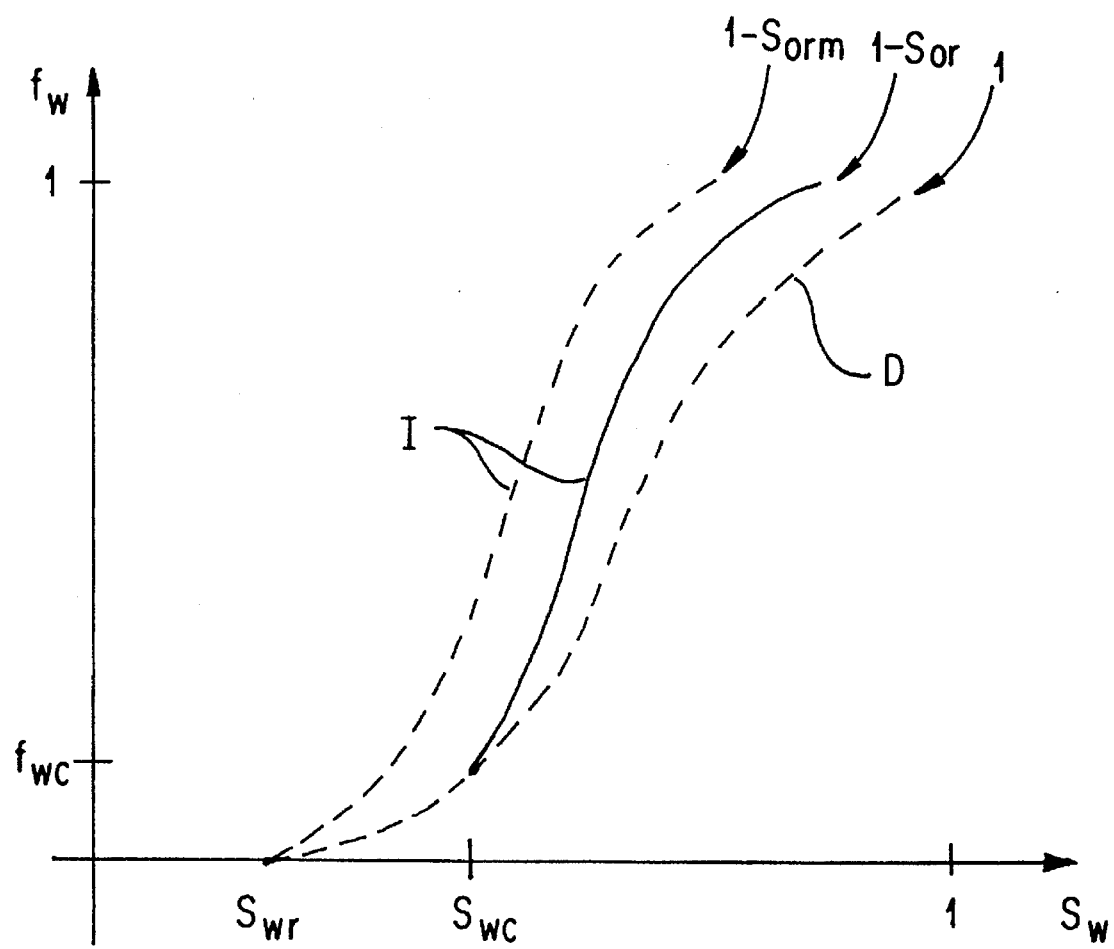
FIG. 2 is an example of a fractional fluid flow diagram.

Referring to FIG. 2, there is shown a typical diagram of fractional flow versus saturation, for example in a sandstone formation. The curve of FIG. 2 illustrates the fractional flow behavior in the rock, and the effect of drainage and imbibition that occurred due to nature, or due to the invasion process. The point on the curve at $S_w=1$ and $f_w=1$ represents the original situation of millions of years ago, with the rock pore spaces fully saturated with sea water (water saturation, $S_w=1$), and the fractional flow of water (defined as the ratio of the flow rate of water to the flow rate of total fluid) also unity ($f_w = 1$). The portion of the curve labelled D is generally referred to as "drainage" and represents water being drained from some of the pore space volume as it is replaced by oil. If this process continued until water no longer flowed ($f_w=0$), the value of water saturation at such point would be commonly referred to as $S_{wr}$; that is, the residual water saturation. The portion of the curve rising from this point, labeled I for "imbibition", represents water imbibing a successively greater fraction of the pore volume and replacing oil, as would occur as filtrate from water-based drilling fluid replaces oil. This curve terminates where all moveable oil has been flushed by water, at the point on the curve where $f_w=1$ (again, only water flows), and the water saturation is $S_w=1-S_{orm}$, where $S_{orm}$ is the maximum residual oil saturation.

As is well known, and evident from the curves of FIG. 2, the fractional flow characteristic exhibits hysteresis. In the description so far, it was assumed that drainage (D) proceeded all the way to $S_{wr}$. When, however, drainage is to an arbitrary connate water saturation, $S_{wc}$, the imbibition (I) follows a different path, and terminates (when only water flows) at $S_w=1-S_{or}$, where $S_{or}$ is the residual oil saturation. The residual oil saturation, $S_{or}$, is generally smaller than the maximum possible residual oil saturation, $S_{orm}$, that resulted from the earlier described situation where drainage proceeded all the way to $S_{wr}$.

FIGS. 3A, 3B and 3C respectively illustrate three types of fractional flow characteristics associated with the three respective saturation profiles illustrated in FIGS. 4A, 4B, and 4C, and with the three respective conductivity profiles illustrated in FIGS. 5A, 5B, and 5C.

Consider, first, the associated diagrams of FIGS. 3A, 4A, and 5A, which respectively represent, for an exemplary formation, the fractional flow versus saturation characteristic (FIG. 3A), the saturation verses radial distance profile (FIG. 4A), and the conductivity verses radial distance profile (FIG. 5A), for a situation where the point ($S_{wc}$, $f_{wc}$) is below the inflection point ($P_I$) of the fractional flow curve. In this situation (which occurs, typically, for $S_{wc}$ less than 0.5, $S_{wc}$ being about 0.2 for this example), a tangent can be constructed from the point ($S_{wc}$, $f_{wc}$) to the fractional flow curve (tangent 310 in FIG. 3A), and another tangent can be constructed from the, origin to the fractional flow curve (tangent 315 in FIG. 3A). The slopes of these tangents can be utilized to determine, respectively, the location of the saturation discontinuity ($r_{sat}$) in the saturation profile, and the salinity discontinuity ($r_{sal}$) in the salinity profile [see, for example, S. E. Buckley et al., Mechanism Of Fluid Displacement In Sands, Trans. Am. Inst. Min. Met. Petr. Eng., 146, 1942; and T. S. Ramakrishnan, Application of Fractional Flow Theory To High pH Flooding, IIT Chicago, PhD Thesis, University Microfilms, 1985]. The associated conductivity profile of FIG. 5A (in which it is assumed that the invading filtrate is less conductive than the connate water) exhibits a characteristic annulus in the region between the salinity discontinuity and the saturation discontinuity. This type of characteristic has been observed to be a signature in zones which contain displaceable hydrocarbons. Campbell et al. (Displacement Logging—A New Exploratory Tool, Petroleum Transactions, AIME, Vol. 204, pp. 233–239, 1955) explained that as filtrate invades the formation, most of the hydrocarbons are pushed out of the invaded zone, leaving residual oil. Owing to diffusion between original formation water and the filtrate, it appears that all the formation water is swept out. Consequently, it appears that the connate water piles up as a bank between the uninvaded formation and the invading filtrate. If the invading mud filtrate is relatively fresher (higher resistivity) than the connate water, the result is an annular zone that has a higher conductivity than the invaded zone, and also has higher conductivity than the virgin oil-bearing formation.

FIGS. 3B, 4B, and 5B illustrate a situation (for example, with $S_{wc}$ about 0.5) where $S_{wc}$ is at a point on the fractional flow curve that is above the inflection point of the curve, so that no tangent can be drawn from the point ($S_{wc}$, $f_{wc}$) to the curve, but still low enough on the curve that one can construct a tangent from the origin to the curve. This tangent is labelled 415 in FIG. 3B. The slope of the line 415 determines the location of the salinity discontinuity ($r_{sal}$ in FIG. 4B), and there is no saturation discontinuity for this case, as seen in FIG. 4B. The associated conductivity profile is illustrated in FIG. 5B, and it is seen that there is a substantial conductivity increase at the position of the salinity discontinuity in this example where the invading filtrate is less conductive than the connate water.

In the example of FIGS. 3C, 4C and 5C (for example, with $S_{wc}$ about 0.65), the point ($S_{wc}$, $f_{wc}$) is above the inflection point of the fractional flow curve and, also, the curve shape and orientation is such that a tangent cannot be drawn from the origin to the curve. In this situation, a line drawn from the origin to the point ($S_{wc}$, $f_{wc}$) [line 525 in FIG. 3C]has a slope that determines the position of the salinity front. FIG. 4C shows that the salinity front in this case (C) is radially beyond the effect of invasion (where $S_w$ becomes constant at $S_{wc}$). 5C shows the conductivity increase at $r_{sal}$ for this case.

Figure 6A:
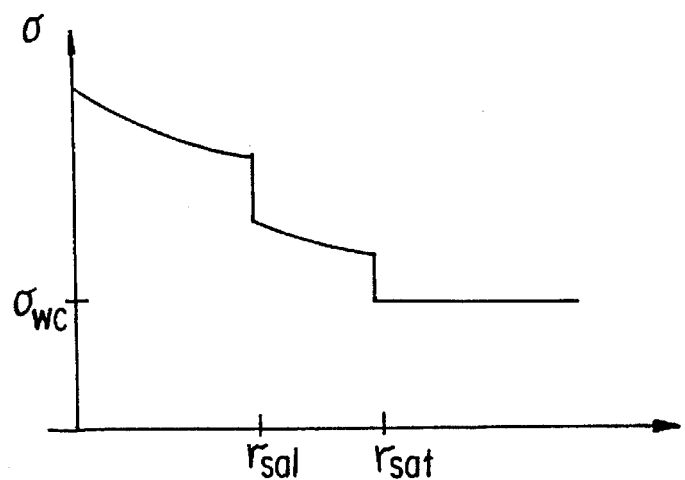
FIGS. 6A, 6B, and 6C represent conductivity profiles, as a function of radial distance, which are respectively associated with the saturation profiles of FIGS. 4A, 4B and 4C, all for the situation where the filtrate is more conductive than the connate water.
Figure 6B:
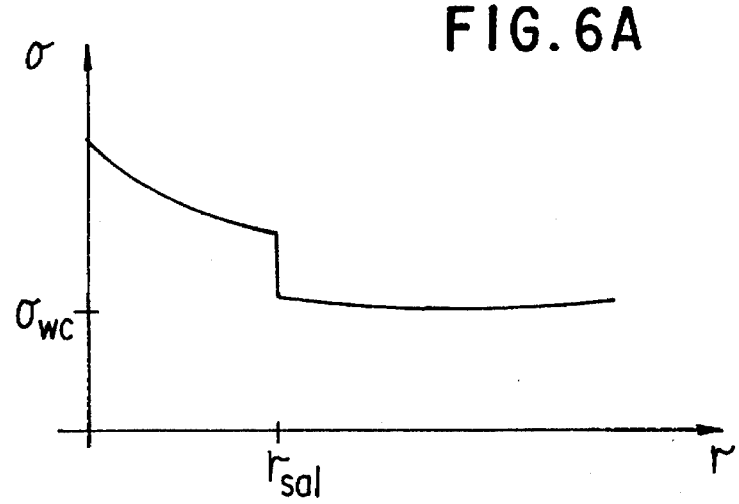
Figure 6C:
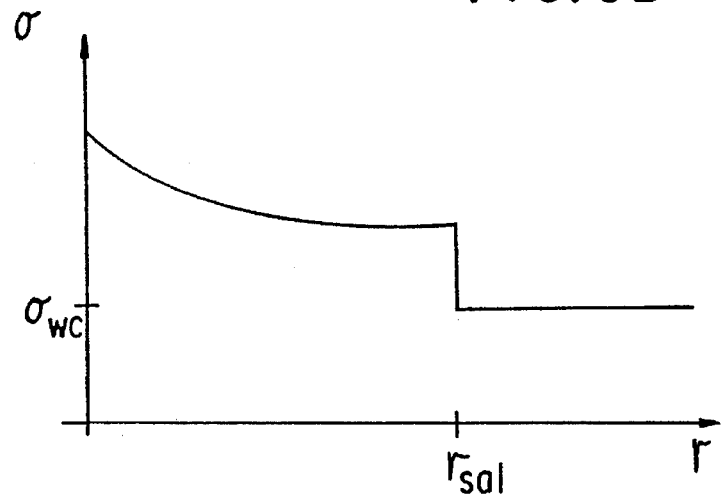

Whereas FIGS. 5A, 5B and 5C show conductivity profiles for cases A, B, and C, respectively, for the situation where the invading filtrate is less conductive than the connate water, FIGS. 6A, 6B and 6C show the corresponding conductivity profiles for the situation where the invading filtrate is more conductive than the connate water. In these cases the conductivity decreases at the saturation discontinuity (for case A, in FIG. 6A), and also decreases at the salinity discontinuities (for each of cases A, B and C, in FIGS. 6A, 6B and 6C, respectively).

Figure 7:
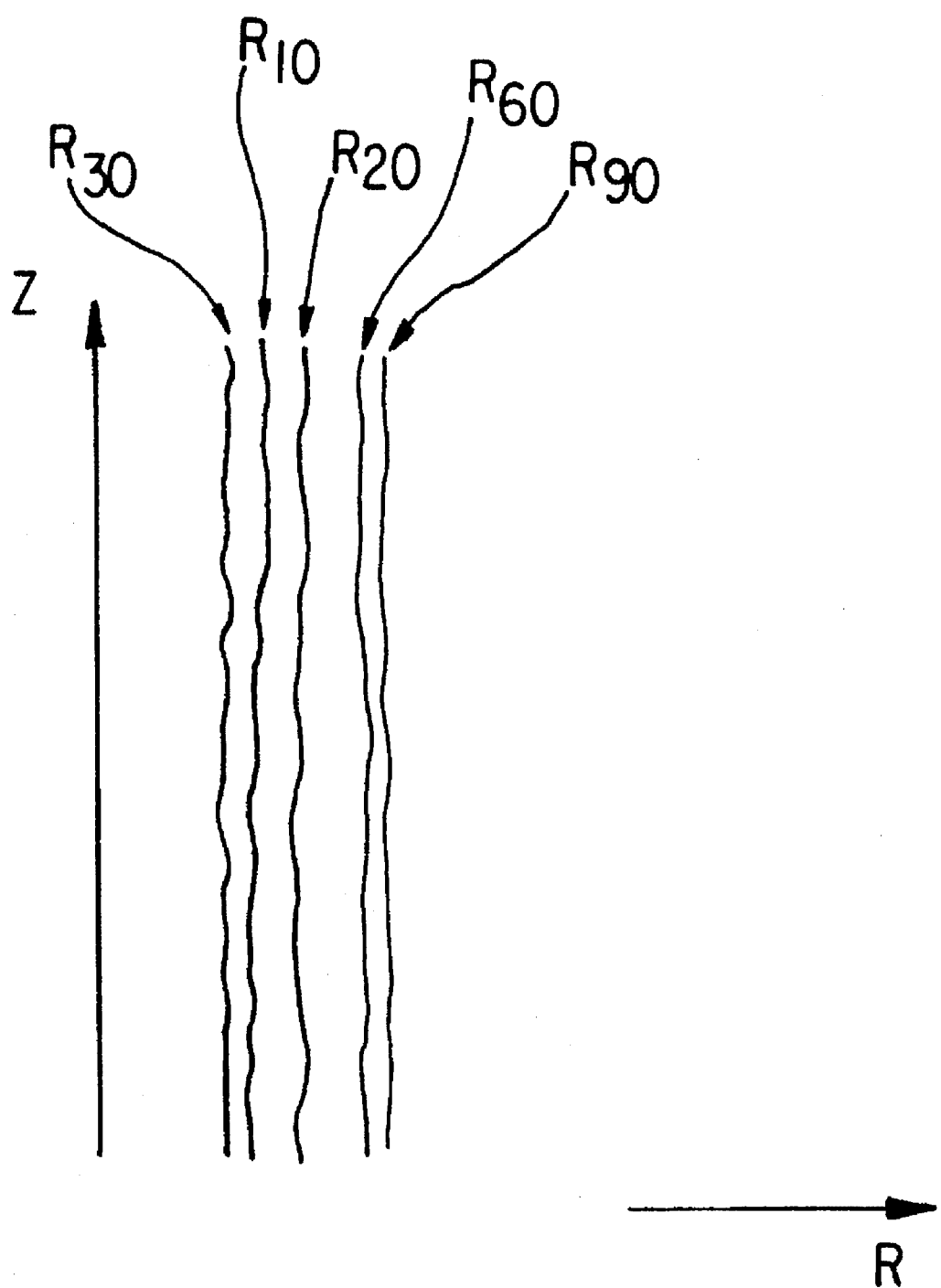
FIG. 7 illustrates an example of the type of resistivity log traces obtained in a formation bed which exhibits the type of characteristics shown in FIGS. 3A, 4A, and 5A.

Referring to FIG. 7, there is shown an example of the type of resistivity log traces obtained in a formation bed which exhibits the type of characteristics illustrated in FIGS. 3A, 4A, and 5A (e.g. an oil-bearing formation, with filtrate less conductive than the connate water, and relatively low water saturation in the virgin formation). Five log traces are illustrated, as obtained from the previously referenced "AIT" resistivity logging device, with resistivity measurements obtained at radial depths of investigation of about 10 inches ($R_{10}$), 20 inches ($R_{20}$), 30 inches ($R_{30}$), 60 inches ($R_{60}$), and 90 inches ($R_{90}$). As seen in FIG. 7, although the connate water is relatively conductive, the deepest measurement ($R_{90}$) is the highest resistivity in this example, since water saturation in the virgin formation is relatively low. The previously described annulus (e.g. between $r_{sat}$ and $r_{sat}$ in FIGS. 4A and 5A) results in $R_{30}$ and $R_{10}$ exhibiting the lowest resistivity in this example.

Figure 8B:
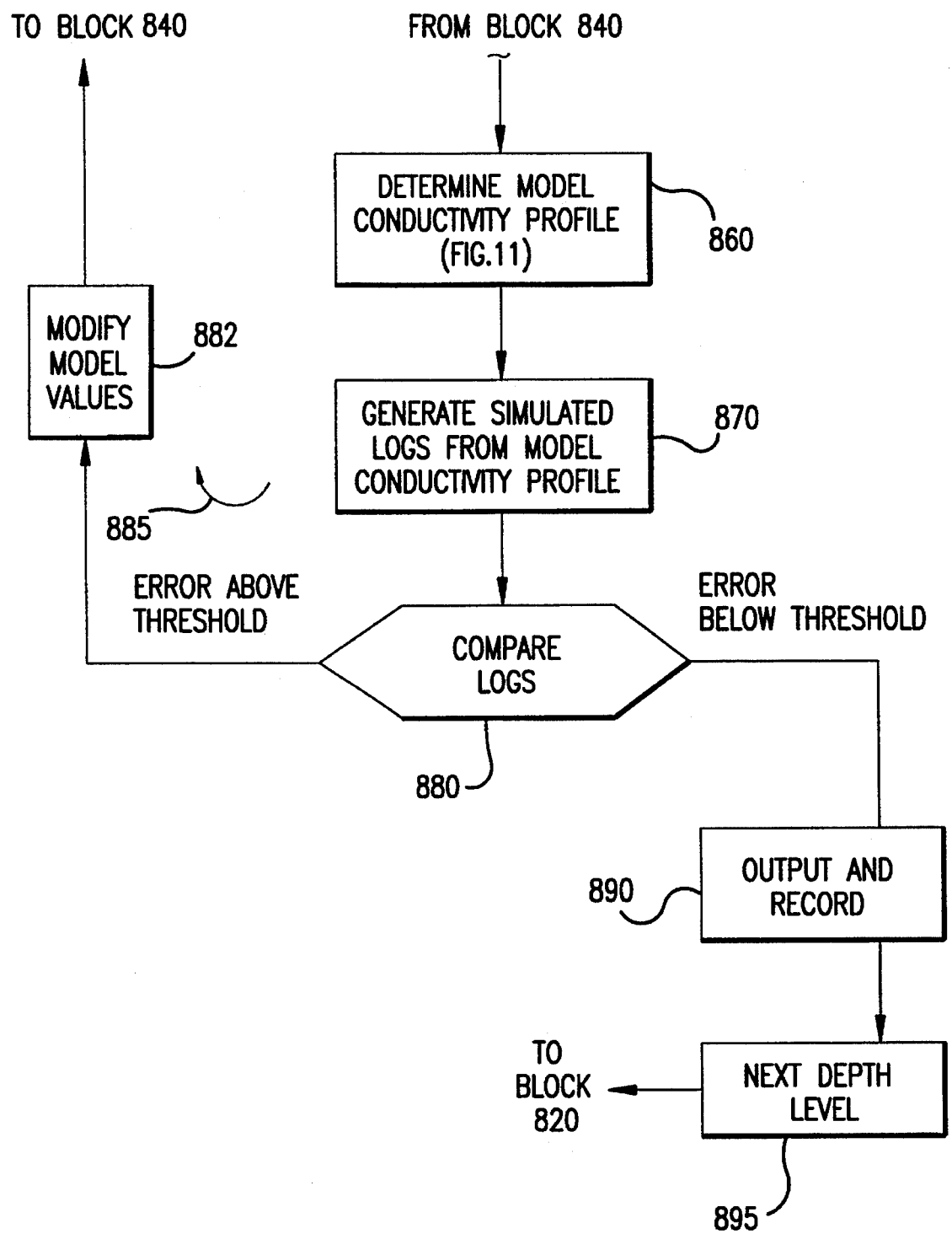
FIG. 8, which includes FIGS. 8A and 8B placed one below another, is a block diagram of a routine for programming a processor, such as the processor of computing module 100 of FIG. 1, in accordance with an embodiment of invention.

Referring to FIG. 8, there-is shown a flow diagram of a routine for programming a processor, such as the processor of computing module 100 (FIG. 1), in accordance with an embodiment of the invention. The block 810 represents the storing of logging measurements from the tool string of the FIG. 1 embodiment, to obtain several resistivity logs and other (optional) logs, as described. The stored logs can be displayed and/or recorded, in conventional fashion, by recorder 90, as represented by the block 815.

The block 820 represents the inputting of certain derived values that can remain fixed during the routine of this embodiment. These values can be obtained, for example, from log measurements, laboratory measurements and/or local or general knowledge. In the present embodiment, values are derived for the porosity $\phi$, the viscosity ratio, $\mu_o/\mu_w$ (the ratio of viscosity of oil to the viscosity of water), the conductivity of the connate water, $\sigma_w$, and the conductivity of the mud filtrate $\sigma_{mf}$. Porosity, $\phi$, may be obtained, for example, from the logging device 43 of FIG. 1. The viscosity ratio may be derived from laboratory measurements, sampling, and/or local knowledge. The conductivity of the connate water, $\sigma_w$, may be derived, for example, from the SP logging device 45 of FIG. 1, or from a relatively deep resistivity log measurement in a local water-bearing bed and the Archie relationship. The conductivity of the mud filtrate can be determined from surface or laboratory measurement. Also utilized in this embodiment are the Archie constant A and the Archie exponents m and n, which can be standard values or determined from local knowledge. [In clay-bearing sands, the Archie relation can be modified to account for the surface conduction of clays with an additional parameter, cation exchange capacity, which may be estimated, for example, from a geochemical log (see e.g. Waxman and Smits, Electrical Conductivities in Oil-Bearing Sands, Soc. Petr. Eng. J., Vol. 8, 1968).]

The block 830 represents the determination of initial model values for the fractional flow parameters, $S_{wc}$, $S_{orm}$, $S_{wr}$, and the total filtrate volume (per unit depth) Q. The routine for selecting these initial model values is described in conjunction with the flow diagram of FIG. 9.

In the present embodiment, the fractional flow curve is parameterized using saturation domain values as variables: $S_{wc}$ (the saturation in the virgin or uninvaded formation), $S_{wr}$ (the residual water saturation), and $S_{orm}$ (the maximum residual oil saturation). It will be understood that other fractional flow characteristics could be used as variables, examples being $f_{wc}$ (the fractional flow of water in the virgin formation) and $\lambda$, the pore size distribution index, upon which the shape of the fractional flow curve depends. In the present embodiment, $\lambda$ is set equal to 2 (its typical value for clean sandstone formations) but, if desired, it can also be a variable. Another variable in this embodiment is Q, which is the total volume of filtrate that has invaded the formation over a given unit of well depth. [For background, reference can be made to T. S. Ramakrishnan et al., Effect Of Capillary Number On The Relative Permeability Function For Two-Phase Flow In Porous Media, Powder Technology, 48, 1986, 99–124; C. S. Land, Soc. Pet. Eng. J., 8, 1968, 149].

Figure 10A:
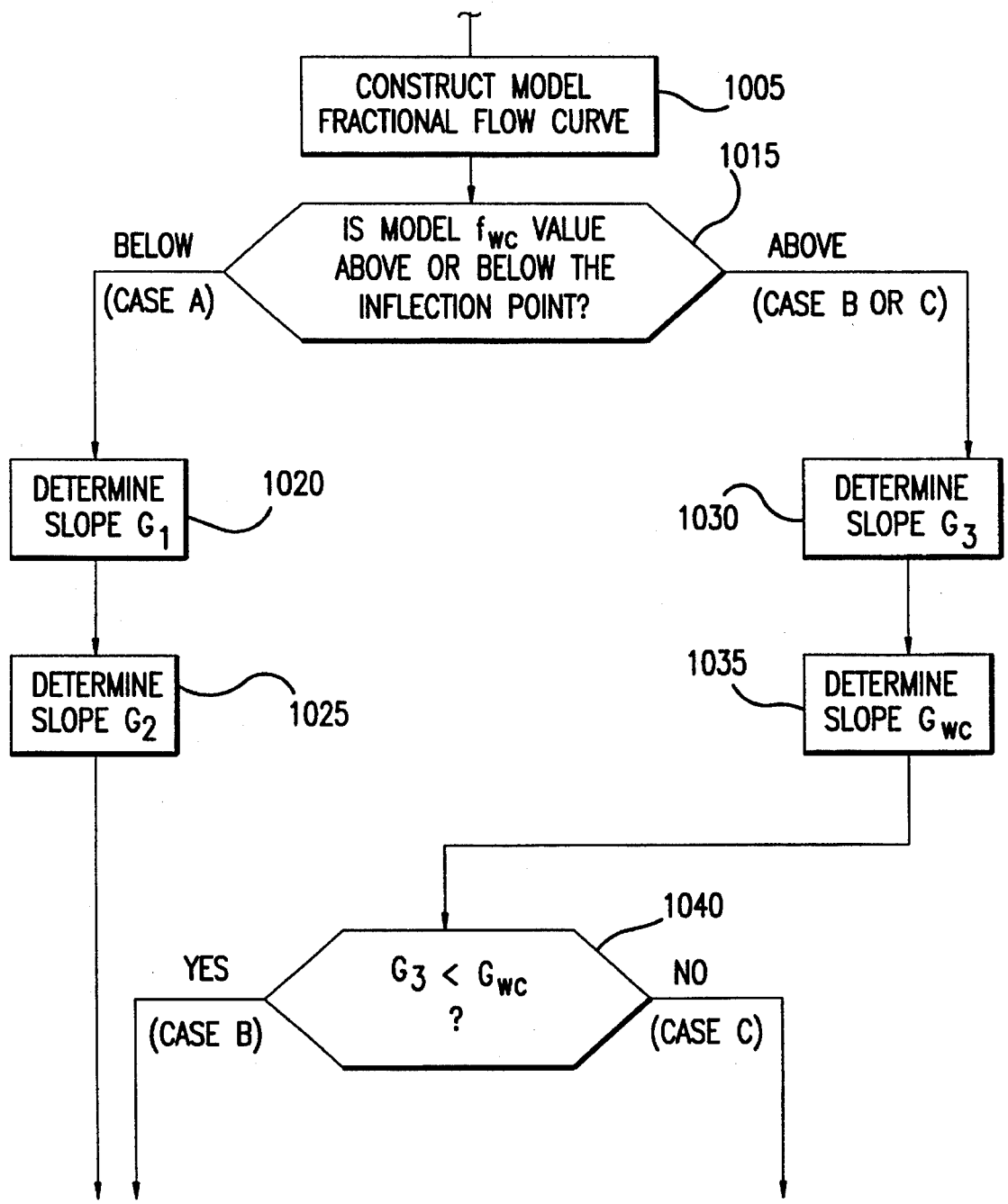
FIG. 10, which includes FIGS. 10A and 10B placed one below another, is a flow diagram of the routine represented by the block 840 of FIG. 8 for determining a saturation profile.
Figure 10B:
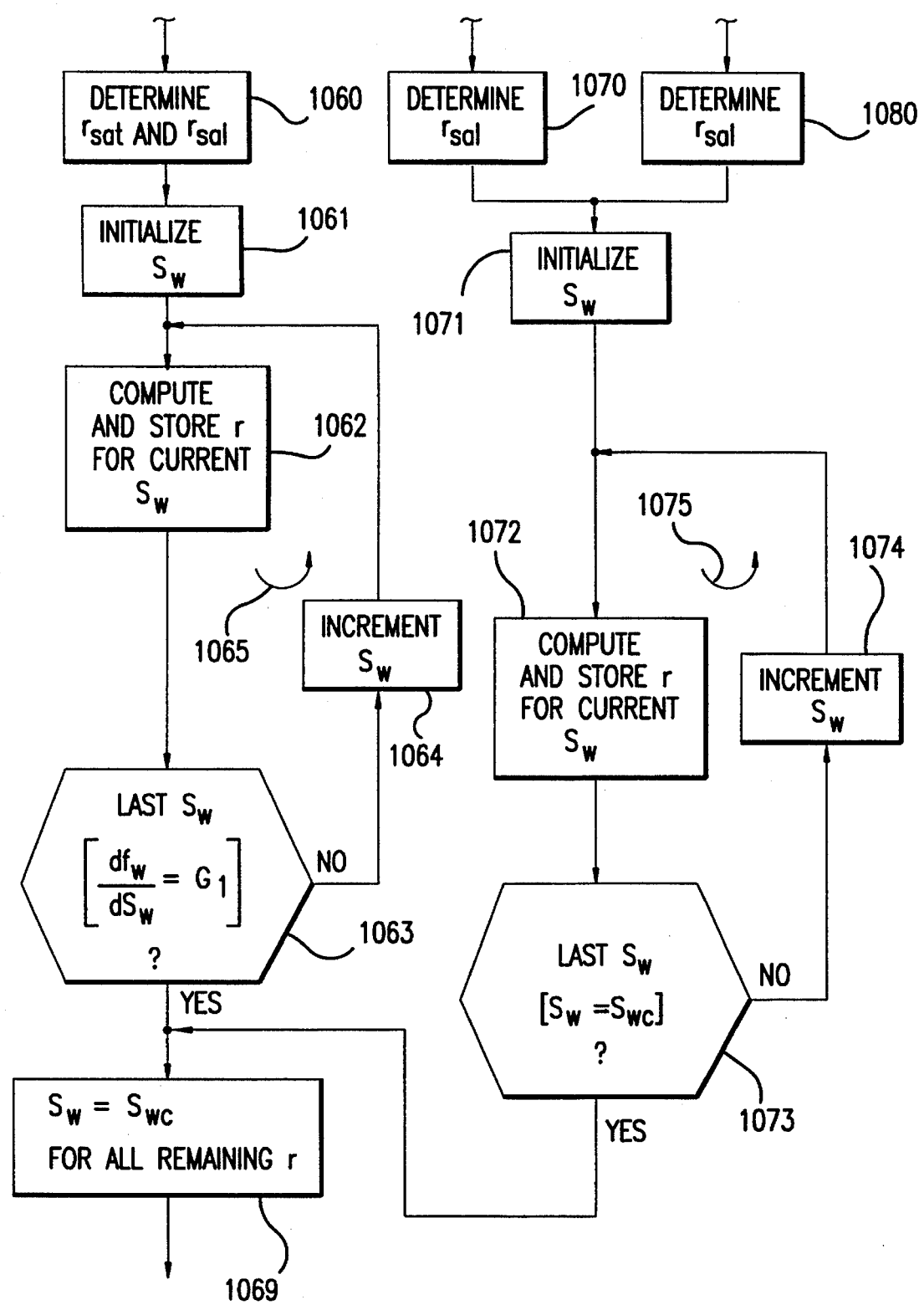

The block 840 is then entered, this block representing the determination of a model saturation profile at the present depth level, the routine for this determination being described in conjunction with the flow diagram of FIG. 10. The block 860 is then entered, this block representing the determination of the model conductivity profile at the current depth level, this routine being described in conjunction with the flow diagram of FIG. 11. The model (simulated) log responses are then determined from the conductivity profile (as represented by the block 870) by using forward modeling.

In the well logging art, so-called "forward modeling" is used for obtaining models of simulated logging device responses. In forward modeling of a resistivity tool, such as an induction tool having a number of coils, the tool characteristic is readily derived from the physical characteristics of the coils, their locations, and the signals applied thereto. The tool characteristic is applied to the formation model and is used to derive simulated logs that would be produced by that logging tool traversing a borehole through the formation model. [Reference can be made to B. Anderson et al., "ELMOD—Putting Electromagnetic Modeling To Work To Improve Resistivity Log Interpretation", Transactions of SPWLA 30th Annual Logging Symposium, June, 1989; and to Hunka et al., "A New Resistivity Measurement System For Deep Formation Imaging And High Resolution Formation Evaluation", Soc. of Petroleum Eng., SPE20559, 1990] The decision block 880 is then entered, this block representing the comparison of the simulated log values with the actual measured logs. There are various known ways in which the comparison can be implemented, such as by computing a root mean square error of normalized differences between the model and measured values. If the error is above a predetermined threshold level, the model values are modified (block 882), the block 840 is re-entered, and the loop 885 continues until the error is close to a minimum or is less than a predetermined threshold value. Usually, the error can be minimized by modifying parameters from one iteration to the next. Modification of values can be implemented in accordance with, for example, a Gauss-Newton Method or a Levenberg-Marqurdt procedure. The block 890 is then entered, this block representing the outputting and recording of the ultimately modified parameter model values. The next depth level can then be considered (block 895) and the block 820 is re-entered for further processing.

Figure 9B:
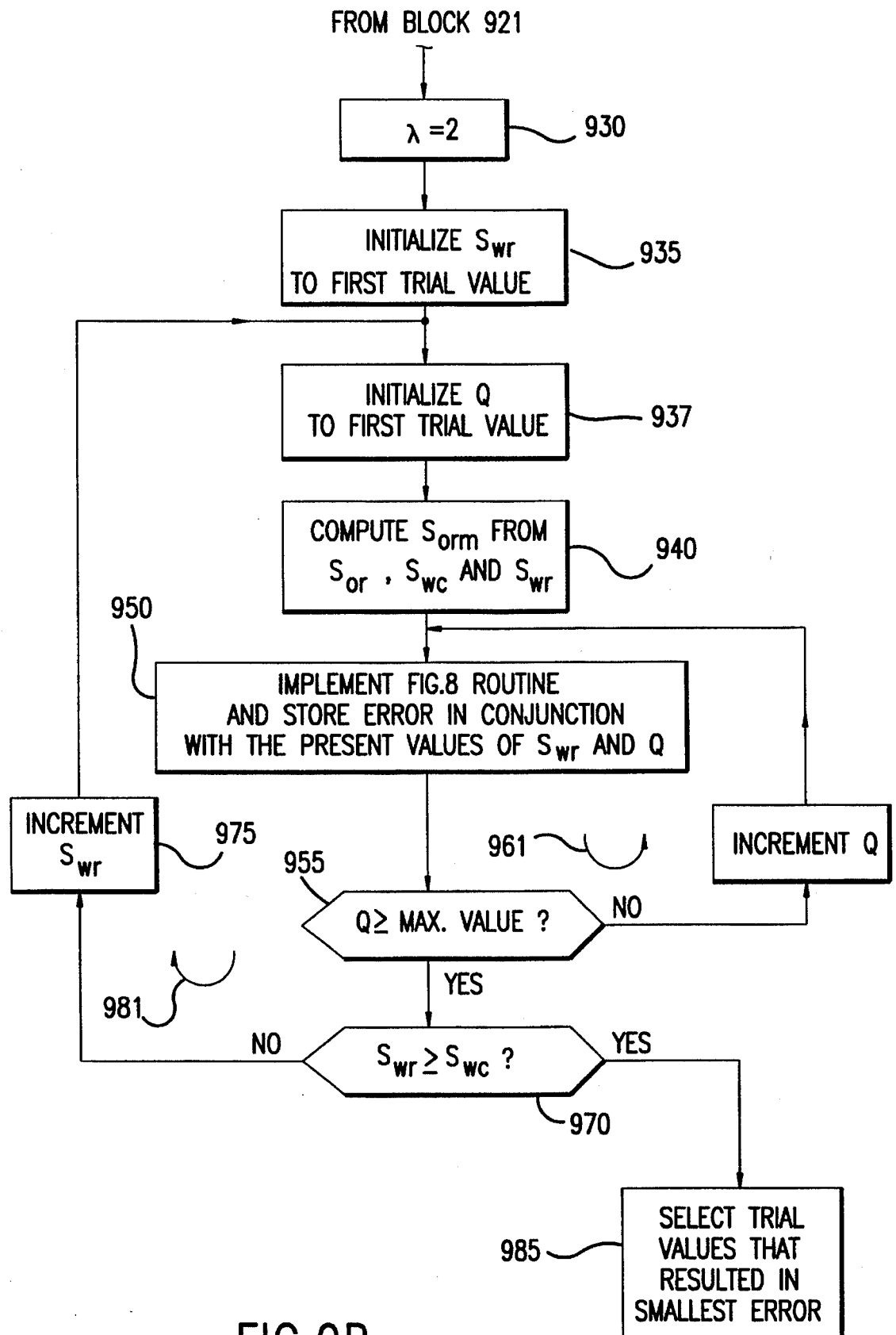
FIG. 9, which includes FIGS. 9A and 9B placed one below another, is a flow diagram of the routine represented by the block 830 of FIG. 8 for selecting initial model values of fractional flow parameters.

Referring to FIG. 9, there is shown a flow diagram of the routine represented by the block 830 of the FIG. 8 flow diagram, for deriving initial model values of the formation fluid flow parameters and Q. The blocks 910–912 represent determination of an initial model value for $S_{or}$; that is, the residual oil saturation (see e.g. FIG. 2). In the present embodiment, the maximum residual oil saturation, $S_{orm}$ is used in the model (although one could use $S_{or}$), and the initial model value of $S_{orm}$ is obtained as a function of the derived value of $S_{or}$, as will be treated hereinbelow. The invaded zone conductivity, $\sigma_{xo}$, is derived from the shallowest resistivity log reading, as represented by the block 910. This may be, for example, the shallowest AIT log reading or the MSFL log measurement, if an MSFL is employed. The water saturation of the invaded zone, $S_{xo}$ can then be determined (block 911) using e.g. the Archie relationship (with porosity and the Archie constant and coefficients having previously been input), and the initial model residual oil saturation, $S_{or}$ is determined as the complement of the water saturation of the invaded zone; i.e., $S_{or} = 1 - S_{xo}$. The blocks 920–921 represent determination of an initial model value of $S_{wc}$; that is, the connate water saturation of the virgin formation. The conductivity of the virgin formation, $\sigma_t$, is determined from a deep resistivity log measurement, such as from the deepest AIT log (block 920). [Alternatively, $\sigma_t$ may be obtained, for example, from a logging while drilling resistivity measurement before there is substantial invasion.] The initial model value for $S_{wc}$ can then be determined from $\sigma_t$ and the same relationship used in determining $S_{xo}$.

In the present embodiment, the initial model value for $S_{wr}$, the residual water saturation, and the initial model value for Q, the total volume of filtrate that entered the formation, are determined by varying them over a two-dimensional grid. $S_{wr}$ is varied from zero to $S_{wc}$ with 0.05 increments, and Q (which has units of area) is varied from zero to 1000 square inches, with 10 square inch increments.

In the example of the present embodiment, the pore size distribution index, $\lambda$, is set equal to 2, as represented by the block 930. The blocks 935 and 937 respectively represent the initializing of $S_{wr}$ and Q at first trial values, namely, $S_{wr}$ at 0, and Q at 0, for the present example. In the routine that follows, $S_{wr}$ and Q are incremented, and the trial values of $S_{wr}$ and Q [in conjunction with the other selected parameter initial values] that result in the smallest error are selected as the initial values for $S_{wr}$ and Q. The block 940 represents the determination of $S_{orm}$ from $S_{or}$, $S_{wc}$ and $S_{wr}$, based on the known relationship therebetween. [See, for example, T. S. Ramakrishnan et al., Effect Of Capillary Number On The Relative Permeability Function For Two-Phase Flow In Porous Media, Powder Technology, 48, 1986, 99–124, C. S. Land, Soc. Pet. Eng. J., 8, 1968, 149]. For each pair of trial values of $S_{wr}$ and Q, the procedure of the FIG. 8 routine is implemented, and an error value is obtained and stored (block 950). Determination is then made (decision block 955) as to whether Q has reached its maximum value, for example Q=1000. If not, Q is incremented to the next trial value (block 960), the block 950 is re-entered, and the loop 961 continues until all values of Q have been tried (in conjunction with the present trial value of $S_{wr}$). When the last Q has been reached, determination is made (decision block 970) as to whether the last trial value of $S_{wr}$ has been reached; that is, whether $S_{wr}$ has reached $S_{wc}$. If not, $S_{wr}$ is incremented to the next trial value (block 975), the block 937 is re-entered, and the loop 981 (which contains the loop 961) continues until all trial values of $S_{wr}$ have been processed. The block 985 is then entered, this block representing the selection of the combination of trial values of Q and $S_{wr}$ that produced the smallest error, and these values of Q and $S_{wr}$ are selected as the initial model parameter values for Q and $S_{wr}$. It will be understood that other techniques for determination of initial model values could be employed.

Referring to FIG. 10, there is shown a flow diagram of the routine for determining the model saturation profile, as represented by the block 840 of FIG. 8. A fractional flow ($f_w$) curve of the type illustrated in FIGS. 3A, 3B, and 3C is completely determined by the initial model fractional flow parameters that were selected, and by the pore size distribution index λ (see, for example, R. H. Brooks et al., J. Irrig. Drain. Div., 92, 1966; and T. S. Ramakrishnan et al., Effect Of Capillary Number On The Relative Permeability Function For Two-Phase Flow In Porous Media, Powder Technology, 48, 1986, 99–124), the construction of the model being represented by the block 1005. Determination is then made (decision block 1015) as to whether the model ($S_{wc}$, $f_{wc}$) value is above or below the inflection point, by computation of the sign of the second derivative. If it is below the inflection point, we have case A [e.g., the example of FIGS. 3A, 4A, 5A—that is, tangents exist to the fractional flow curve from the point ($S_{wc}$, $f_{wc}$) and from the origin]. In this case, the block 1020 is entered. Determination is then made, as represented by the blocks 1020 and 1025, of the slope ($G_1$) of the line from the model point ($S_{wc}$, $f_{wc}$) to the fractional flow curve, and the slope ($G_2$) of the line from the origin to the fractional flow curve.

For the situation where the determination of decision block 1015 is that the model point ($S_{wc}$, $f_{wc}$) is above the inflection point [meaning that we have either case B or case C], determination is made as to whether we have case B [where a tangent can be drawn to the $f_w$ curve from the origin, as in FIG. 3B] or case C [where a tangent cannot be drawn to the $f_w$ curve, as in FIG. 3C.] This is done by determining the slope ($G_3$) of a line from the origin to the model point ($S_{wc}$, $f_{wc}$), as represented by the block 1030, and also determining the slope ($G_{wc}$) of the $f_w$ curve at the model point ($S_{wc}$, $f_{wc}$), as represented by the block 1035. If the slope $G_3$ is less than the slope $G_{wc}$, then it is evident that a tangent could be drawn to the curve from the origin (the slope of which is $G_2$), so we have case B. If the opposite is true, we have case C. This determination is represented by the decision block 1040. Summarizing to this point, the routine has determined which case (A, B, or C) is indicated, and has determined the slopes $G_1$ and $G_2$ for case A, the slope $G_2$ for case B, and the slope $G_3$ for case C.

In the next portion of the routine, the following equation (1) is used to determine the relationship between saturation and radial distance (i.e., the saturation profile associated with the present model, for the case (A, B, or C), as already determined:

$$r(S_w) = \sqrt{r_{wb}^2 + \frac{df_w}{dS_w} \frac{Q}{\pi\phi}} \qquad (1)$$

where $r_{wb}$ is the radius of the wellbore. In this embodiment, the radial distance for a given saturation $S_w$ is computed in terms of the slope (that is, the derivative of $f_w$ with respect to $S_w$) of the $f_w$ curve.

The previously developed slopes, $G_1$, $G_2$ and $G_3$ are related to saturation and salinity discontinuities [for the general theory, see e.g. T. S. Ramakrishnan, Application of Fractional Flow Theory To High pH Flooding, IIT Chicago, PhD Thesis, University Microfilms, 1985] in accordance with the following equations $$r_{sat} = \sqrt{r_{wb}^2 + G_1 \frac{Q}{\pi\phi}} \qquad (2)$$

$$r_{sal} = \sqrt{r_{wb}^2 + G_2 \frac{Q}{\pi\phi}} \qquad (3)$$

$$r_{sal} = \sqrt{r_{wb}^2 + G_3 \frac{Q}{\pi\phi}} \qquad (4)$$

where, as previously described, $r_{sat}$ and $r_{sal}$ are the saturation discontinuity and salinity discontinuity, respectively. For case A, the radial position of the saturation discontinuity, $r_{sat}$, can be determined from equation (2) [and depends on the slope $G_1$], and the radial position of the salinity discontinuity ($r_{sa}$) can be determined from equation (3) and depends on the slope $G_2$, this determination being represented by the block 1060. Regarding case B, the position of the salinity discontinuity can be determined from equation (3) [and depends on the slope $G_2$], this determination being represented by the block 1070. Regarding case C, the position of the salinity discontinuity can be determined from equation (4) [and depends on the slope $G_3$], this determination being represented by the block 1080.

For each case (A, B, or C), the next portion of the routine implements computation of r as a function of the slope of $f_w$, in accordance with equation (1).

For the case A situation, the block 1061 is entered, this block representing the initializing of a variable $S_w$ at the model value 1-$S_{or}$, which is the highest value of water saturation. The block 1062 is then entered, this block representing the computation and storing of r using equation (1). Decision block 1063 is then entered, and determination is made as to whether the last $S_w$ has been reached. In this case, the process continues until the derivative of $f_w$ with respect to $S_w$ equals the slope $G_1$. If this condition has not been reached, $S_w$ is incremented (block 1064) and the loop 1065 continues until the last $S_w$ is reached; that is, until the slope of the $f_w$ curve equals $G_1$. As previously described [see equation (2) and FIGS. 3A and 4A], this is the radial position of the saturation discontinuity, $r_{sat}$. The block 1069 is then entered, this block representing the storage of $S_{wc}$ for values of r greater than $r_{sat}$ (see, again, FIG. 4A), which means that the saturation profile value in the virgin zone is set at $S_{wc}$.

For cases B and C, a loop similar to the loop 1067 is utilized. In this case, $S_w$ is initialized, as before (block 1071), r is computed and stored (block 1073), $S_w$ is incremented (block 1074), and the loop 1077 continues until the last value of $S_w$ is reached, whereupon the block 1069 is entered. In this case, as seen in FIGS. 3B and 4B, there is no saturation jump, and the criterion of block 1073 is whether $S_w$ has reached $S_{wc}$.

Figure 11:
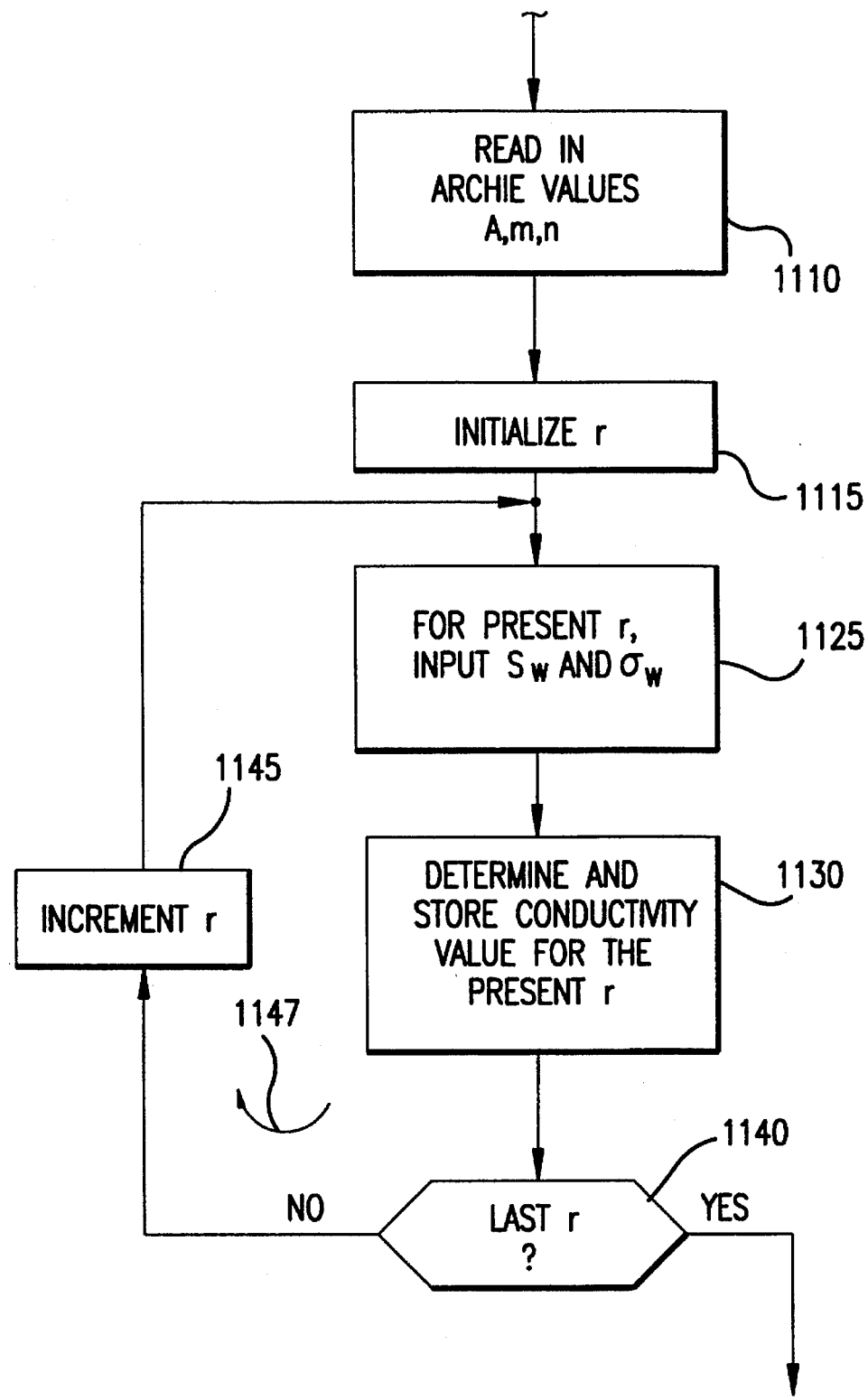
FIG. 11 is a flow diagram of the routine represented by the block 860 of FIG. 8 for determining a conductivity profile.

Referring to FIG. 11, there is shown a flow diagram of the routine represented by block 860 of the FIG. 8 flow diagram, for determining a model conductivity profile from the saturation profile. The block 1110 represents the reading in of the Archie equation (or equivalent) values; namely, the constant A and the exponents, m and n (as also referred to and used above). Typical values are A=1, m=2 and n=2. The radial distance variable, r, is initialized, as represented by the block 1115. Next, as represented by the block 1125, for the present value of r, $S_w$ and $\sigma_w$ are input, from the stored saturation profile value at this r. In the invaded zone (to the left of the salinity discontinuity in FIGS. 4A, 4B, and 4C), the conductivity $\sigma_w$ is the filtrate conductivity, $\sigma_{mf}$, and to the right of the salinity front in FIGS. 4A, 4B, and 4C, the water conductivity is the connate water conductivity $\sigma_{wc}$. Conductivity, for the present r, can then be determined, for example using the Archie relationship:

$$\sigma = A\sigma_w \phi^m s_w^n \qquad (5)$$

where $\phi$ is the previously input porosity, and $\sigma_w$ and $S_w$ are, respectively, the water conductivity and water saturation for the present r. This determination is represented by the block 1130. Determination is then made (decision block 1140) as to whether the last r to be processed has been reached. If not, r is incremented (block 1145), block 1125 is re-entered, and the loop 1147 continues until the conductivity profile has been developed for all desired r. In the illustrated embodiment hereof, the tool conductivity response is implemented in terms of a one-dimensional conductivity profile as a function of radial distance, although it will be understood that, for example, a two-dimensional conductivity response can be determined that takes into account the derived conductivity values at adjacent depth levels [see e.g. B. Anderson et al., "ELMOD—Putting Electromagnetic Modeling To Work To Improve Resistivity Log Interpretation", Transactions of SPWLA 30th Annual Logging Symposium, June, 1989; and to Hunka et al., "A New Resistivity Measurement System For Deep Formation Imaging And High Resolution Formation Evaluation", Soc. of Petroleum Eng., SPE20559, 1990]

The invention has been described with reference to a particular preferred embodiment, but variations within the spirit and scope of the invention will occur to those skilled in the art. For example, it will be understood that relative permeability can be represented as a function of $S_w$ with the parameters $S_{orm}$, $S_{wc}$, $S_{wr}$, and $\lambda$, and, therefore, a log of relative permeability can be produced. Further, it will be understood that individual processing steps of routines of the illustrated embodiment could be combined. Also, it will be understood that iterations could be continued until there are no substantial differences in model parameter values, when an error threshold criterion has not been met.

We claim:

1. A method for producing a log of fractional flow characteristics of formations surrounding an earth borehole, comprising the steps of:

a) suspending a logging tool in the borehole;

b) producing several resistivity measurements, having respectively different radial depths of investigation, as said logging tool is moved through said borehole, to obtain several resistivity logs;

c) selecting model fractional flow parameters;

d) determining a formation conductivity model as a function of said model fractional flow parameters;

e) generating several simulated resistivity log values at said respective radial depths of investigation from said, formation conductivity model;

f) comparing said simulated resistivity log values with values from said resistivity logs obtained from said resistivity measurements to obtain an error indication;

g) modifying said model fractional flow parameters;

h) repeating steps (d) through (g) until a predetermined criterion is met; and i) outputting said modified fractional flow parameters as formation fractional flow characteristics.

2. The method as defined by claim 1, further comprising repeating steps (c) through (i) for different depth levels to produce at least one log of fractional flow characteristics.

3. The method as defined by claim 1, wherein said step of determining a formation conductivity model as a function of said model fractional flow parameters comprises:

determining a formation saturation profile as a function of said model fractional flow parameters; and determining said formation conductivity model from said saturation profile.

4. The method as defined by claim 2, wherein said step of determining a formation conductivity model as a function of said model fractional flow parameters comprises:

determining a formation saturation profile as a function of said model fractional flow parameters; and determining said formation conductivity model from said saturation profile.

5. The method as defined by claim 1, wherein said fractional flow characteristics comprise connate water saturation, residual water saturation, and residual oil saturation.

6. The method as defined by claim 2, wherein said fractional flow characteristics comprise connate water saturation, residual water saturation, and residual oil saturation.

7. The method as defined by claim 3, wherein said fractional flow characteristics comprise connate water saturation, residual water saturation, and residual oil saturation.

8. The method as defined by claim 4, wherein said fractional flow characteristics comprise connate water saturation, residual water saturation, and residual oil saturation.

9. The method as defined by claim 5, wherein said residual oil saturation comprises maximum residual oil saturation.

10. The method as defined by claim 8, wherein said residual oil saturation comprises maximum residual oil saturation.

11. The method as defined by claim 3, wherein said step of determining said formation conductivity model from said saturation profile includes deriving formation porosity and water conductivity, and determining said formation conductivity model from said derived porosity, said derived water conductivity, and said saturation profile.

12. The method as defined by claim 4, wherein said step of determining said formation conductivity model from said saturation profile includes deriving formation porosity and water conductivity, and determining said formation conductivity model from said derived porosity, said derived water conductivity, and said saturation profile.

13. The method as defined by claim 8, wherein said step of determining said formation conductivity model from said saturation profile includes deriving formation porosity and water conductivity, and determining said formation conductivity model from said derived porosity, said derived water conductivity, and said saturation profile.

14. The method as defined by claim 1, further comprising selecting a model fluid volume parameter in step (c), and wherein said formation conductivity model is determined as a function of said model fluid volume parameter and said model fractional flow parameters, and wherein said step (g) of modifying fractional flow parameters includes modifying said model fluid volume parameter.

15. The method as defined by claim 4, further comprising selecting a model fluid volume parameter in step (c), and wherein said formation conductivity model is determined as a function of said model fluid volume parameter and said model fractional flow parameters, and wherein said step (g) of modifying fractional flow parameters includes modifying said model fluid volume parameter.

16. The method as defined by claim 8, further comprising selecting a model fluid volume parameter in step (c), and wherein said formation conductivity model is determined as a function of said model fluid volume parameter and said model fractional flow parameters, and wherein said step (g) of modifying fractional flow parameters includes modifying said model fluid volume parameter.

17. The method as defined by claim 1, wherein said predetermined criterion comprises said error indication being less than a predetermined threshold.

18. The method as defined by claim 2, wherein said predetermined criterion comprises said error indication being less than a predetermined threshold.

19. The method as defined by claim 4, wherein said predetermined criterion comprises said error indication being less than a predetermined threshold.

20. The method as defined by claim 1, wherein said several resistivity measurements comprise five resistivity measurements.

21. The method as defined by claim 4, wherein said several resistivity measurements comprise five resistivity measurements.

* * * * *